US010903115B2

(12) United States Patent
Murray et al.

(10) Patent No.: US 10,903,115 B2
(45) Date of Patent: Jan. 26, 2021

(54) CONTROLLING GRAIN BOUNDARIES IN HIGH ASPECT-RATIO CONDUCTIVE REGIONS

(71) Applicant: International Business Machines Corporation, Armonk, NY (US)

(72) Inventors: Conal Murray, Yorktown Heights, NY (US); Chih-Chao Yang, Glenmont, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

(21) Appl. No.: 16/732,616

(22) Filed: Jan. 2, 2020

(65) Prior Publication Data

US 2020/0135556 A1 Apr. 30, 2020

Related U.S. Application Data

(62) Division of application No. 16/003,766, filed on Jun. 8, 2018, now Pat. No. 10,600,686.

(51) Int. Cl.
*H01L 21/768* (2006.01)
*H01L 23/532* (2006.01)

(52) U.S. Cl.
CPC .... *H01L 21/76877* (2013.01); *H01L 21/7682* (2013.01); *H01L 21/76837* (2013.01); *H01L 21/76864* (2013.01); *H01L 23/53238* (2013.01)

(58) Field of Classification Search
CPC ......... H01L 21/76877; H01L 21/76864; H01L 23/53238; H01L 21/76837; H01L 21/7682
See application file for complete search history.

(56) References Cited

U.S. PATENT DOCUMENTS

| 6,043,153 | A  | 3/2000  | Nogami et al.     |
|-----------|----|---------|-------------------|
| 6,103,624 | A  | 8/2000  | Nogami et al.     |
| 6,654,172 | B2 | 11/2003 | Pond et al.       |
| 6,835,657 | B2 | 12/2004 | Ong               |
| 6,979,625 | B1 | 12/2005 | Woo et al.        |
| 8,772,161 | B2 | 7/2014  | Cabral, Jr. et al.|
| 8,852,305 | B2 | 10/2014 | Andersson et al.  |
| 8,864,861 | B2 | 10/2014 | Andersson et al.  |
| 8,888,841 | B2 | 11/2014 | Pandelidis et al. |
| 8,893,711 | B2 | 11/2014 | Kennedy et al.    |
| 8,895,099 | B2 | 11/2014 | Atanasoska et al. |

(Continued)

OTHER PUBLICATIONS

Anonymous, "Method for copper-film grain growth by changing the film stress", IPCOM000146542D, Feb. 16, 2007, pp. 1-5.

(Continued)

*Primary Examiner* — John P. Dulka
(74) *Attorney, Agent, or Firm* — Cantor Colburn LLP; Randall Bluestone

(57) ABSTRACT

Methods for forming high aspect-ratio conductive regions of a metallization network with reduced grain boundaries are described. Aspects of the invention include forming a trench in a dielectric material on the substrate. A conductive material is formed in the trench, wherein the conductive material includes a first grain boundary level. Portions of the dielectric material are removed to expose sidewalls of the conductive material. The conductive material is annealed to reduce the first grain boundary level.

6 Claims, 9 Drawing Sheets

(56) References Cited

U.S. PATENT DOCUMENTS

| | | | |
|---|---|---|---|
| 8,993,472 B2 | 3/2015 | Roller et al. | |
| 9,005,769 B2 | 4/2015 | Lambert et al. | |
| 9,017,762 B2 | 4/2015 | Rozak et al. | |
| 9,023,486 B2 | 5/2015 | Nagaraj et al. | |
| 9,031,184 B2 | 5/2015 | Cabrero et al. | |
| 9,034,465 B2 | 5/2015 | Peters et al. | |
| 9,034,479 B2 | 5/2015 | Nagaraj et al. | |
| 9,379,187 B2 | 6/2016 | Kang et al. | |
| 9,412,658 B2 | 8/2016 | Gluschenkov et al. | |
| 9,768,295 B2 | 9/2017 | Hossain et al. | |
| 2004/0219779 A1 | 11/2004 | Basol et al. | |
| 2005/0067297 A1 | 3/2005 | Tench et al. | |
| 2007/0238294 A1 | 10/2007 | Beyer et al. | |
| 2009/0206484 A1 | 8/2009 | Baker-O'Neal et al. | |
| 2009/0273085 A1 | 11/2009 | Jourdan et al. | |
| 2011/0034026 A1* | 2/2011 | Sunayama | H01L 21/2885 438/653 |
| 2012/0080793 A1 | 4/2012 | Danek et al. | |
| 2013/0062769 A1 | 3/2013 | Cabral, Jr. et al. | |
| 2013/0187273 A1 | 7/2013 | Zhang et al. | |
| 2014/0301861 A1 | 10/2014 | Bruce et al. | |
| 2014/0324156 A1 | 10/2014 | Yin et al. | |
| 2015/0108647 A1 | 4/2015 | Zhang et al. | |
| 2015/0129087 A1 | 5/2015 | Hintz et al. | |
| 2015/0132926 A1 | 5/2015 | D'Evelyn et al. | |
| 2015/0348832 A1 | 12/2015 | Bruce et al. | |
| 2016/0028003 A1 | 1/2016 | Wang | |
| 2019/0378755 A1 | 12/2019 | Murray et al. | |

OTHER PUBLICATIONS

Anonymous, "Method to create a thin large copper grain copper film from ECD copper for Copper subtractive etch integration approach", IPCOM000239887D, Sep. 12, 2014, pp. 1-6.

Bosman et al.., "Encapsulated annealing: Enhancing the plasmon quality factor in lithographically-defined nanostructures", Scientific reports, 4, 5537-1 to 6 (2014).

Joseph et al., "Advanced plasma etch for the 10nm node and beyond", Proc. SPIE Symposium on Advanced Lithography, vol. 8685, pp. 86850A-1 to 8 (2013).

List of IBM Patents or Patent Applications Treated as Related; Date Filed: Jan. 2, 2020; 2 pages.

* cited by examiner

CONTROLLING GRAIN BOUNDARIES IN HIGH ASPECT-RATIO CONDUCTIVE REGIONS

DOMESTIC PRIORITY

This application is a divisional of U.S. patent application Ser. No. 16/003,766, filed Jun. 8, 2018, the disclosure of which is incorporated by reference herein in its entirety.

BACKGROUND

The present invention generally relates to fabrication methods and resulting structures for semiconductor devices. More specifically, the present invention relates to methods and structure for controlling the amount and type of grain boundaries in high aspect-ratio conductive regions of a metallization network.

Semiconductor devices and components, which are referred to collectively herein as integrated circuit (IC) components, include a plurality of circuit elements (e.g., transistors, resistors, diodes, capacitors, etc.) communicatively connected together on a semiconductor substrate (i.e., a wafer or a chip). IC components are coupled to one another by a metallization network of interconnected layers and conductive regions formed in regions in the wafer/chip. The interconnect layers and conductive regions are often formed from copper (Cu), which facilitates the development of smaller metal components, reduces energy usage, and facilitates the fabrication of higher-performance processors. Copper, like most metals, is commonly found in polycrystalline form.

SUMMARY

Embodiments of the present invention are directed to a method of forming a conductive trench in a substrate. A non-limiting example of the method includes forming a trench in a dielectric material on the substrate. A conductive material is formed in the trench, wherein the conductive material includes a first grain boundary level. Portions of the dielectric material are removed to expose sidewalls of the conductive material. The conductive material is annealed to reduce the first grain boundary level.

Embodiments of the present invention are directed to a method of forming conductive regions in a substrate. A non-limiting example of the method includes forming a first trench in a dielectric material on the substrate. A second trench is formed in the dielectric material on the substrate. A first conductive material is formed in the first trench, wherein the first conductive material includes a first grain boundary level and a second conductive material is formed in the second trench, wherein the second conductive material includes a second grain boundary level. Portions of the dielectric material are removed to expose sidewalls of the first conductive material and the first conductive material is annealed to reduce the first grain boundary level.

Embodiments of the present invention are directed to a semiconductor structure. A non-limiting example of the semiconductor structure includes a first conductive material formed in a first trench, wherein the first conductive material includes a first grain boundary level and a second conductive material formed in a second trench, wherein the second conductive material includes a second grain boundary level. A third conductive material formed in a third trench, wherein the third conductive material includes a third grain boundary level. A first liner layer formed over the first conductive material and the second conductive material and a second liner layer formed over the first liner layer and the third conductive material.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIGS. 1-7 depict a method for forming high aspect ratio conductive regions having controlled grain boundaries according to embodiments of the invention, in which:

FIG. 1 depicts a cross-sectional view of a portion of a metallization network of a semiconductor substrate after initial fabrication operations according to one or more embodiments of the invention;

FIG. 2 depicts a cross-sectional view of the metallization network of the semiconductor substrate after fabrication operations according to one or more embodiments of the invention;

FIG. 3 depicts a cross-sectional view of the metallization network of the semiconductor substrate after fabrication operations according to one or more embodiments of the invention;

FIG. 4 depicts a cross-sectional view of the metallization network of the semiconductor substrate after fabrication operations according to one or more embodiments of the invention;

FIG. 5 depicts a cross-section view of the metallization network of the semiconductor substrate after fabrication operations according to one or more embodiments of the invention;

FIG. 6 depicts a cross-section view of the metallization network of the semiconductor substrate after fabrication operations according to one or more embodiments of the invention; and FIG. 7 depicts a cross-sectional view of the metallization network of the semiconductor substrate after fabrication operations according to one or more embodiments of the invention;

Figure 1:
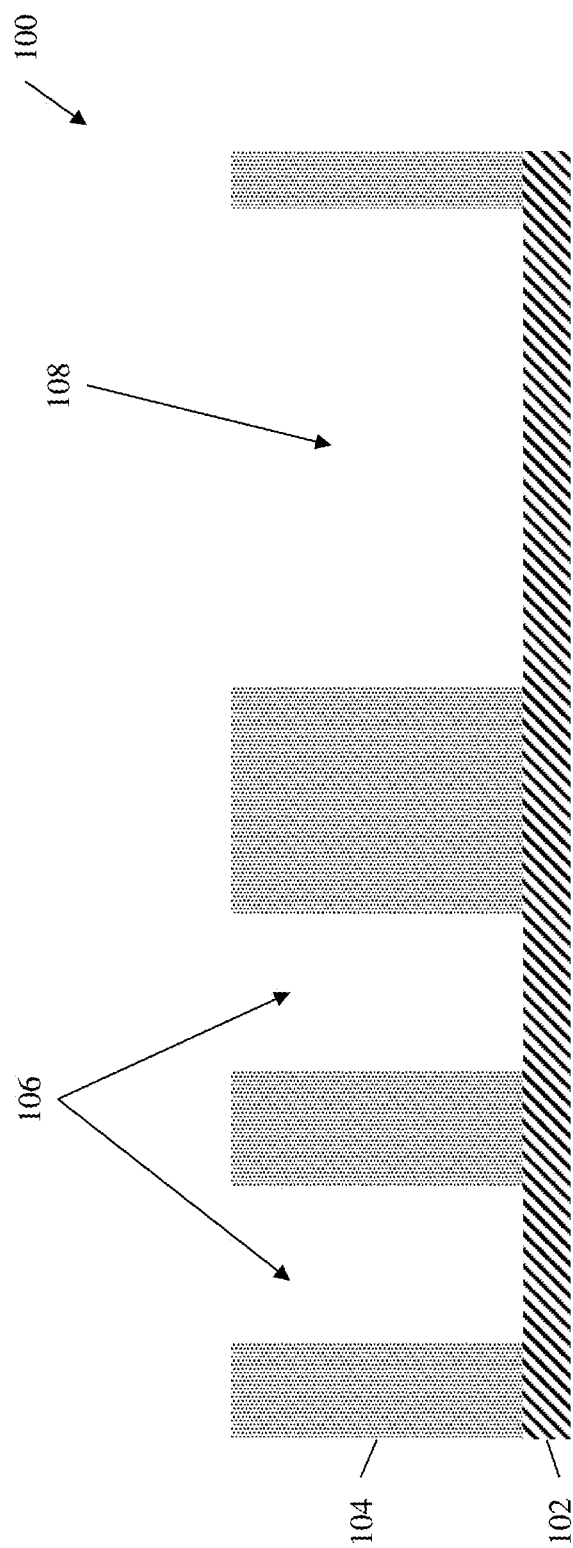

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the described embodiments, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the invention, semiconductor devices are used in a variety of electronic applications. An IC is typically formed from various circuit configurations of semiconductor devices (e.g., transistors, capacitors, resistors, etc.) and conductive interconnect layers (known as metallization layers) formed on semiconductor wafers. Alternatively, semiconductor devices can be formed as monolithic devices, e.g., discrete devices. Semiconductor devices and conductive interconnect layers are formed on semiconductor wafers by depositing many types of thin films of material over the semiconductor wafers, patterning the thin films, doping selective regions of the semiconductor wafers, etc.

In contemporary semiconductor fabrication processes, a large number of semiconductor devices and a conductive metallization network are fabricated in and on a single wafer. The conductive metallization network serve as a network of pathways that transport signals throughout an IC, thereby connecting circuit components of the IC into a functioning whole and to the outside world. The metallization network includes interconnect layers that vary in number and type depending on the complexity of the device. The interconnect layers are themselves interconnected by a network of conductive regions formed on or in the wafer(s) of the IC. For example, in some IC architectures, a conductive region is, in effect, an electrical contact that extends into a dielectric layer formed on the semiconductor wafer or die. As IC feature sizes continue to decrease, the aspect ratio, (i.e., the ratio of height/depth to width) of features such as conductive regions generally increases. Fabricating intricate structures of conductive interconnect layers and conductive regions within an increasingly smaller IC footprint is one of the most process-intensive and cost-sensitive portions of semiconductor IC fabrication.

Interconnect layers and conductive regions formed in regions in the wafer/chip are often formed from copper, which facilitates the development of smaller metal components, reduces energy usage, and facilitates the fabrication of higher-performance processors. The fabrication operations used to form copper conductive regions can include forming a trench in a dielectric layer over the substrate, over-filling the trench with copper, and planarizing the over-fill (or overburden) using, for example, a chemical mechanical planarization (CMP) process.

Although forming conductive regions formed in regions in the wafer/chip from copper provides technical benefits, the use of copper in these conductive regions also presents challenges, particularly when the conductive regions have a high aspect ratio (e.g., a height/width ratio greater than about 2.5). For example, most metals including copper are commonly found in polycrystalline form. In other words, copper is composed of many small regions called grains that have different orientations of the crystal structure. Between the grains are grain boundaries, which are regions of extreme disorder in the crystal structure. Grain boundaries in conductive regions increase overall resistance and introduce signal delay. In general, materials can be characterized as crystalline, polycrystalline or amorphous. A crystal or crystalline solid is a solid material having constituent atoms, molecules or ions arranged in an ordered pattern extending in all three spatial dimensions. When the periodicity in the crystal structure is interrupted at so-called grain boundaries, the crystal is said to be polycrystalline. A polycrystalline solid is a solid material having constituent atoms, molecules or ions are arranged in many ordered patterns fused together into a single solid. An amorphous or non-crystalline solid is a solid material having constituent atoms, molecules or ions having no periodic structure whatsoever. Thus, amorphous solids lack the long-range order characteristic of a crystal.

As noted above, a crystal or crystalline solid is a solid material having constituent atoms, molecules or ions arranged in an ordered pattern extending in all three spatial dimensions. A crystalline solid's lattice structure is the regular array of points about which the atoms, ions or molecules composing the crystal are centered. In addition to their microscopic structure, large crystals are usually identifiable by their macroscopic geometrical shape, which consists of flat faces with specific characteristic orientations. Small 3-dimensional repeating segments called unit cells are responsible for the order found in crystalline solids. The unit cells can be thought of as a boxes, which, when stacked together in 3-dimensions, produce the crystal lattice. There are a limited number of unit cells that can be repeated in an orderly pattern in three dimensions. In the cubic crystal system, three types of arrangements are found, namely, simple cubic, body-centered cubic and face-centered cubic. The process of crystal formation via mechanisms of crystal growth is known as crystallization or solidification.

As device dimensions decrease in semiconductor technology, higher aspect-ratio conductive regions are included in metallization networks. Known methods for reducing grain boundaries in conductive regions include applying annealing operations during fabrication of the conductive region. For example, the annealing operations are typically applied after the previously described overfill deposition but before the CMP operations. However, known approaches to applying such annealing operations are ineffective when the aspect ratio of the conductive region is greater than about 2.5. Some techniques for reducing grain boundaries in high aspect-ratio conductive regions include subtractive patterning of blanket copper files with intrinsically larger grain size. However, etching of such films to produce lines can be problematic due to poor control of the sidewall profiles. Thus, it is desirable to provide fabrication methods and resulting structures configured and arranged to generate high aspect-ratio (e.g., about 2.5) conductive regions with large grains and minimized grain boundaries.

Turning now to an overview of aspects of the invention, one or more embodiments of the invention address the above-described shortcomings of the prior art by providing fabrication methods and resulting structures to form high aspect-ratio (or narrow) conductive regions (conductive interconnects/trenches) with large grains and reduced grain boundaries. In embodiments of the invention, an anneal process is applied to the high aspect-ratio conductive region in order to reduce grain boundaries in the conductive material that forms the conductive region. In embodiments of the invention, the efficacy of the anneal is improved by increasing the amount of exposed surface areas of the high aspect-ratio conductive trench prior to applying the anneal. In embodiments of the invention, the exposed surfaces of the high aspect-ratio conductive region include sidewalls of the conductive region. In embodiments of the invention, the exposed surfaces of the high aspect-ratio conductive trench include a top surface and sidewalls of the conductive region. In embodiments of the invention, the anneal drives heat through the additional exposed surfaces of the high aspect-ratio conductive regions, thereby increasing the pathways for heat to enter the high aspect-ratio conductive trench, thereby increasing the effectiveness of the heat in forming large grains and reduced grain boundaries.

In embodiments of the invention, by exposing surface areas of the high aspect-ratio conductive region, fabrication of the final conductive region will require the application of a liner layer that surrounds the conductive region. In embodiments of the invention, the liner layer is applied after the above-described anneal and directly to the conductive material that forms the conductive region. Because the liner layer is deposited directly on the conductive material of the conductive region rather than being deposited, for example, directly in a trench formed in a dielectric material of the substrate, the material of the liner layer can be selected independent of dielectric surface conditions (e.g., roughness, porosity, impurities, etc.).

In some embodiments of the invention, the above-described fabrication methods, wherein the anneal efficacy is improved by exposing additional surfaces of the conductive region, can also be applied to low aspect-ratio conductive regions to even further minimize grain boundaries in the low aspect-ratio conductive regions.

Turning now to a more detailed description of aspects of the present invention, FIGS. 1-7 depict a method for forming a metallization network having both high aspect-ratio and low aspect ratio conductive regions, wherein the high aspect ratio regions are fabricated in a manner that controls (i.e., reduces) grain boundaries according to embodiments of the invention. More specifically, FIG. 1 depicts a cross-sectional view of a portion of a metallization network 100 after known fabrication operations have been used to form a substrate 102, a dielectric insulating layer 104, a low aspect-ratio trench 108, and high-aspect ratio trench 106. The number of low-aspect ratio trench 108 and high-aspect ratio trench 106 depicted in FIG. 1 are for ease of illustration and description. In embodiments of the invention, any number and/or combination of low-aspect ratio trenchs 108 and high aspect-ratio trenchs 106 can be used. In embodiments of the invention, an aspect-ratio above about 2.5 is considered a high-aspect ratio, and an aspect-ratio below about 2.5 is considered a low-aspect ratio. In the present detailed description, high-aspect ratio structures (e.g., conductive vias, trenches, interconnects, regions, and the like) can be described as "narrow" structures, and low-aspect ratio structures (e.g., conductive vias, trenches, interconnect, regions, and the like) can be described as "wide" structures.

The substrate 102 can be any type of semiconductor material including but not limited to silicon. The dielectric insulating layer 104 can include any type of dielectric including but not limited to silicon oxides or silicon nitrides. In one or more embodiments of the invention, both wide trenches 108 and narrow trenches 106 are formed in the dielectric insulating layer 104 by lithographical patterning.

Figure 2:
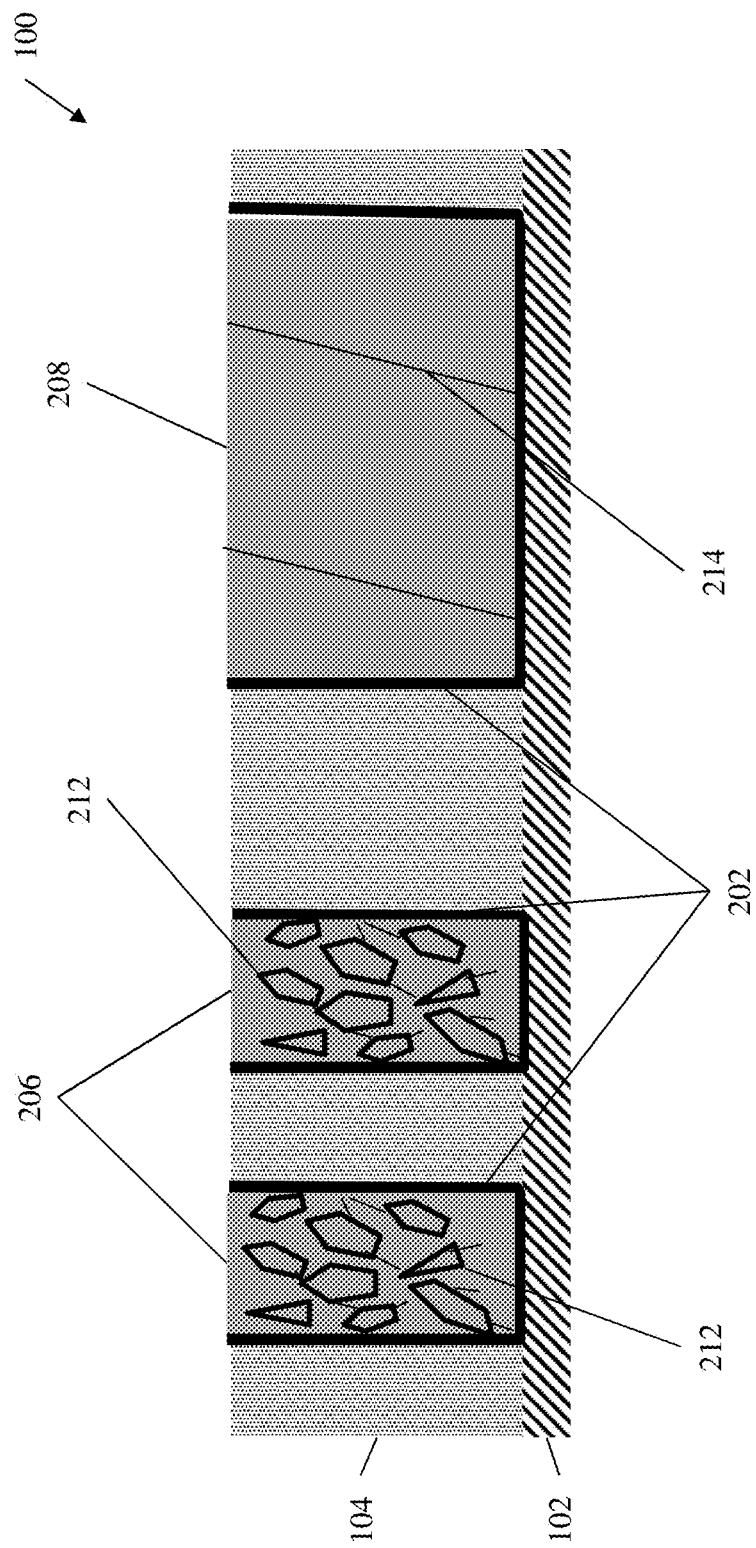

FIG. 2 depicts a cross-sectional view of the metallization network 100 after known semiconductor fabrication operations have been used to deposit conductive material 206, 208 in the trenches 106, 108 (shown in FIG. 1) of the dielectric insulating layer 104 according to one or more embodiments of the invention. In embodiments of the invention, the known fabrication operations include conformally depositing a liner layer 202 on the dielectric insulating layer 104 and along sidewalls of the trenches 106, 108. The known fabrication operations further include depositing conductive material 206, 208 on the liner layer 202. Deposition of the conductive material 208, 208 can be performed by any means including electroplating, for example. The liner layer 202 can be tantalum, titanium, colbalt, ruthenium, and any of their nitrides and alloys, for example. The conductive material 206, 208 can be any type of conductive material including but not limited to copper, aluminum, tungsten, colbalt, ruthenium, and iridium. In embodiments of the invention, the conductive materials 206, 208 are each polycrystalline materials having grain boundaries 212, 214, which are interfaces between two grains, or crystallites, in the polycrystalline conductive materials 206, 208. The grain boundaries 212, 214 are essentially two-dimensional defects in the crystal structure of the conductive materials 206, 208, and tend to decrease the electrical and thermal conductivity of the material. Grain growth is the increase in the size of grains in a polycrystalline material.

The known fabrication operations used to deposit conductive material 206, 208 over the liner layer 202 and in the regions 106, 108 can include over-filling the trenches 106, 108 with the conductive material 206, 208 and planarizing the over-fill (or overburden) using, for example, a CMP process. In embodiments of the invention, initial annealing operations are applied after the above-described overfill deposition but before the CMP operations to reduce grain boundaries by driving grain growth from the top of the exposed portions of the overburden (not shown) of the conductive material 206, 208 downward into the conductive material 206, 208. However, the initial anneal operations are considerably more effective on the conductive material 208 in the low aspect-ratio trench 108 (shown in FIG. 1) than on the conductive material 206 in the high aspect-ratio trench 106 (shown in FIG. 1). Hence, the initial anneal operations result in a less-than-full grain growth in the conductive material 206, thereby resulting in smaller grains 212. However, the initial anneal operations result in close-to-full grain growth in the conductive material 208, thereby resulting in big metal grains 214.

Figure 3:
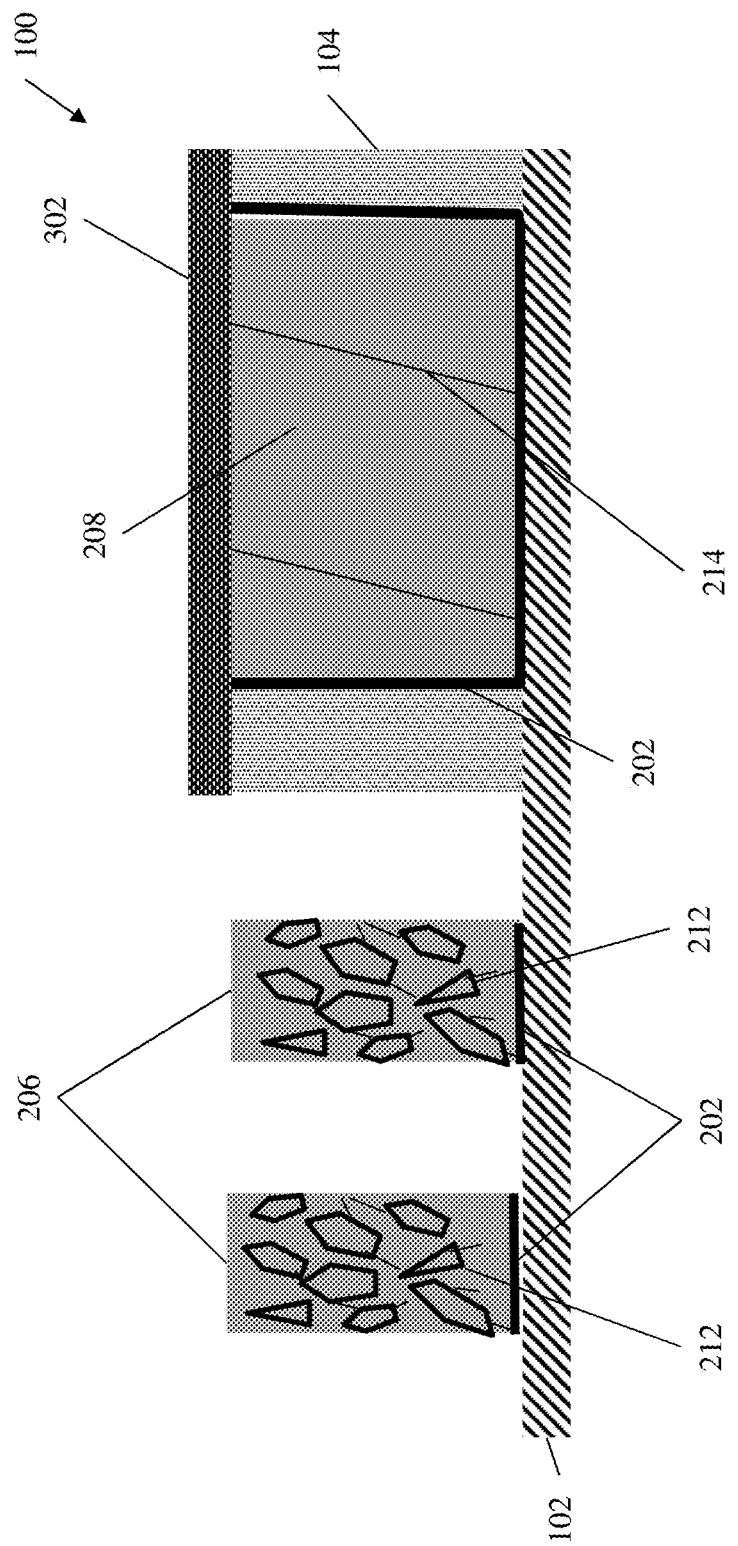

In FIG. 3, known semiconductor fabrication operations have been used to expose sidewalls of the narrow conductive material 206 according to one or more embodiments of the invention. In embodiments of the invention, the known fabrication operations include depositing a hard mask 302 over the wide conductive material 208, and then removing selected portions of the dielectric insulating layer 104 and liner layer 202 to expose the sidewalls of the narrow conductive material 206. The selected portions of the dielectric insulating layer 104 and the liner layer 202 can be removed utilizing a wet etch, a dry etch, or any combination of the two. For example, a plasma treatment combined with a wet etch can remove the portions of the dielectric 104 and liner layer 202. The plasma can contain chlorine, fluorine, or carbon tetrafluoride. The wet etch can include hydrofluoric acid, hydrochloric acid, or sulfuric acid mixed with hydrogen peroxide.

Figure 4:
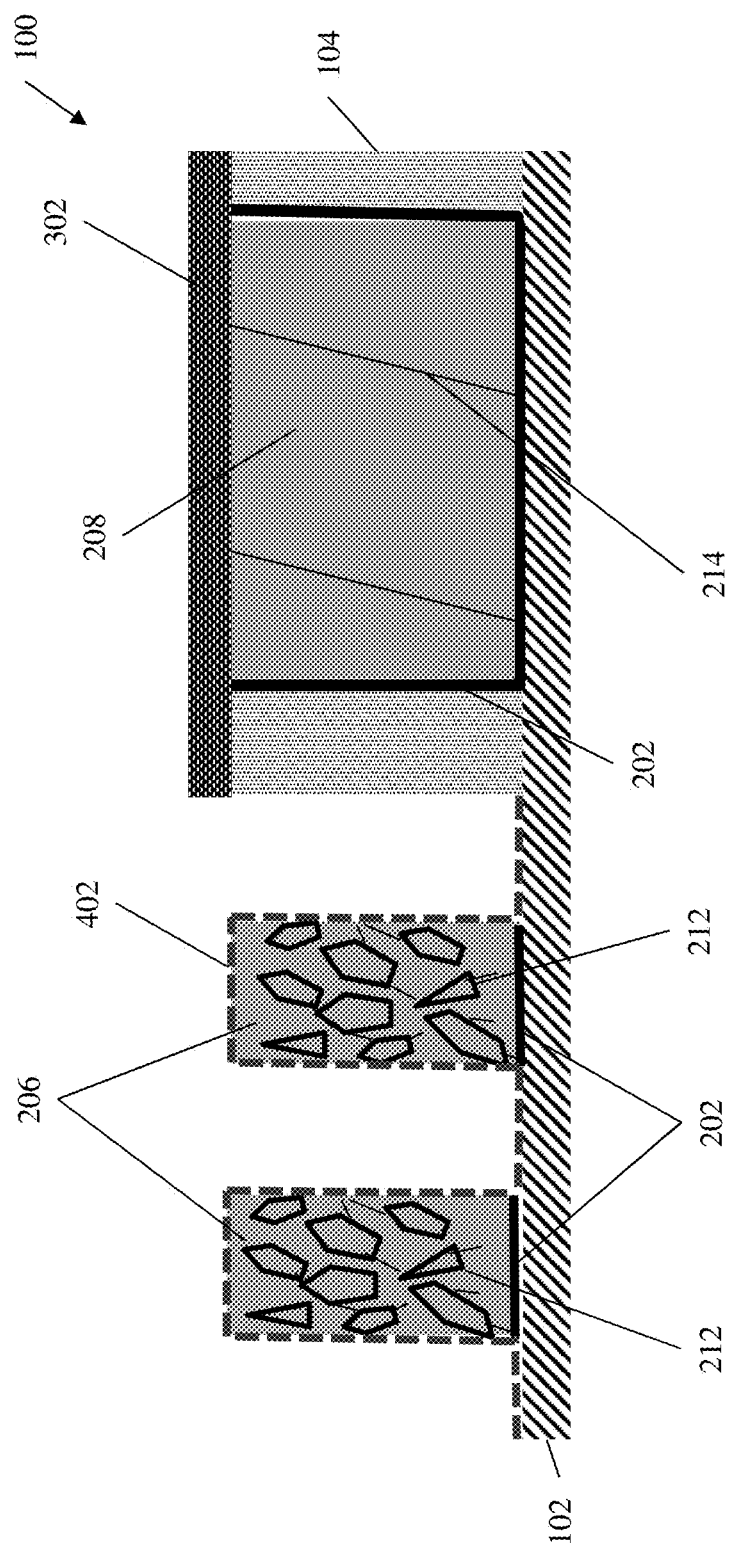

In FIG. 4, known semiconductor fabrication operations have been used to deposit an optional conformal hydrogen silsesquioxane (HSQ) protective layer 402 over the narrow conductive material 206 and portions of the substrate 102. In embodiments of the invention, the optional protective layer 402 can be formed from hydrogen silsesquioxane (HSQ). In accordance with embodiments of the invention, and as described below in connection with the description of FIG. 5, a second anneal is applied to drive heat through the exposed sidewalls and top surfaces of the conductive material 206 to reduce grain boundaries by driving grain growth from the exposed surfaces of the conductive material 206 into the conductive material 206. The protective layer 402 has a thickness and a material type that are selected to protect the surface of the conductive material 206 and to mitigate agglomeration of the conductive material 206 during the second anneal. The protective layer 402 has a thickness and a material type that are selected to maintain the structural integrity of the conductive material 206 during the second anneal. The HSQ layer 402 can be later remove through a dilute hydrofluoric acid etch.

Figure 5:
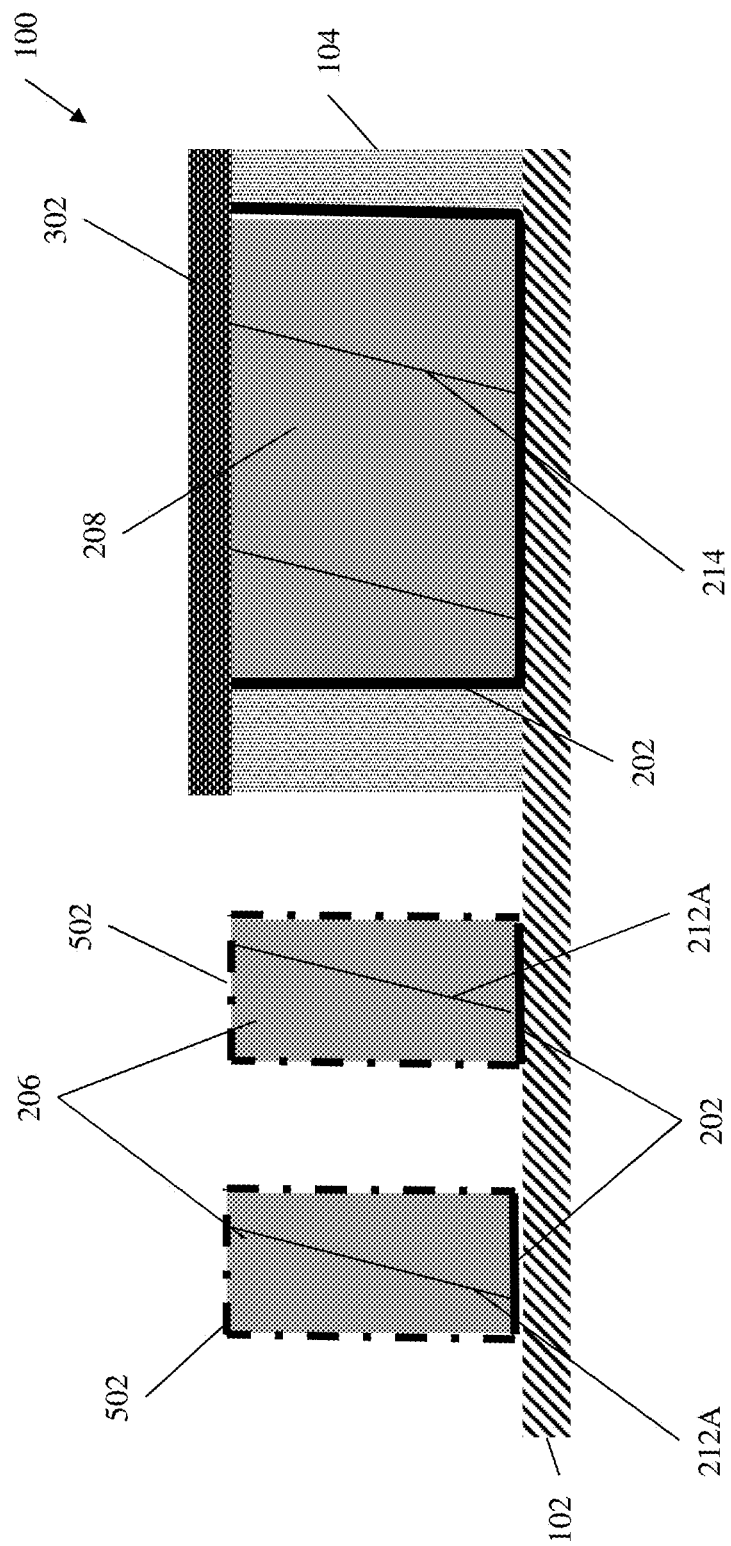

In FIG. 5, prior to deposition of a liner layer 502, a second anneal has been performed on the conductive material 206. The second anneal can be a thermal anneal with a temperature range of about 100 C to 500 C for a time period of about 20 minutes to 5 hours. The second anneal can also be a laser anneal with a temperature range of about 400 C to about 1200 C for a time period of 20 nanoseconds to about 15 minutes. The second anneal drives heat through the exposed sidewall and top surfaces of the conductive material 206 to reduce grain boundary levels, which are depicted as 212A. The second anneal is labeled herein as "second" for ease of explanation. In embodiments of the invention, the second anneal is stand alone, and it is not required that the second anneal take place after the first anneal has failed to result in the reduced grain boundaries 212A.

Continuing with FIG. 5, known semiconductor fabrication operations have been used to deposit a liner layer 502 on the exposed portions of the conductive material 206. In embodiments of the invention for which the optional protective layer 402 was used, the liner layer 502 can be deposited over the protective layer 402. In embodiments of the invention for which the optional protective layer 402 was not used or after its removal, the liner layer 502 can be directly deposited on the exposed surfaces of the conductive material 206. The liner layer 502 is used to prevent interdiffusion or reactions between the conductive material 206 and the subsequent dielectric insulating layer 702. Because the liner layer 502 is deposited directly on the conductive material 206 rather than being deposited directly on the dielectric material 104 (e.g., as was done with the liner 202), the material of the liner 502 can be selected independent of dielectric surface conditions (e.g., roughness, porosity, impurities, etc.).

Figure 6:
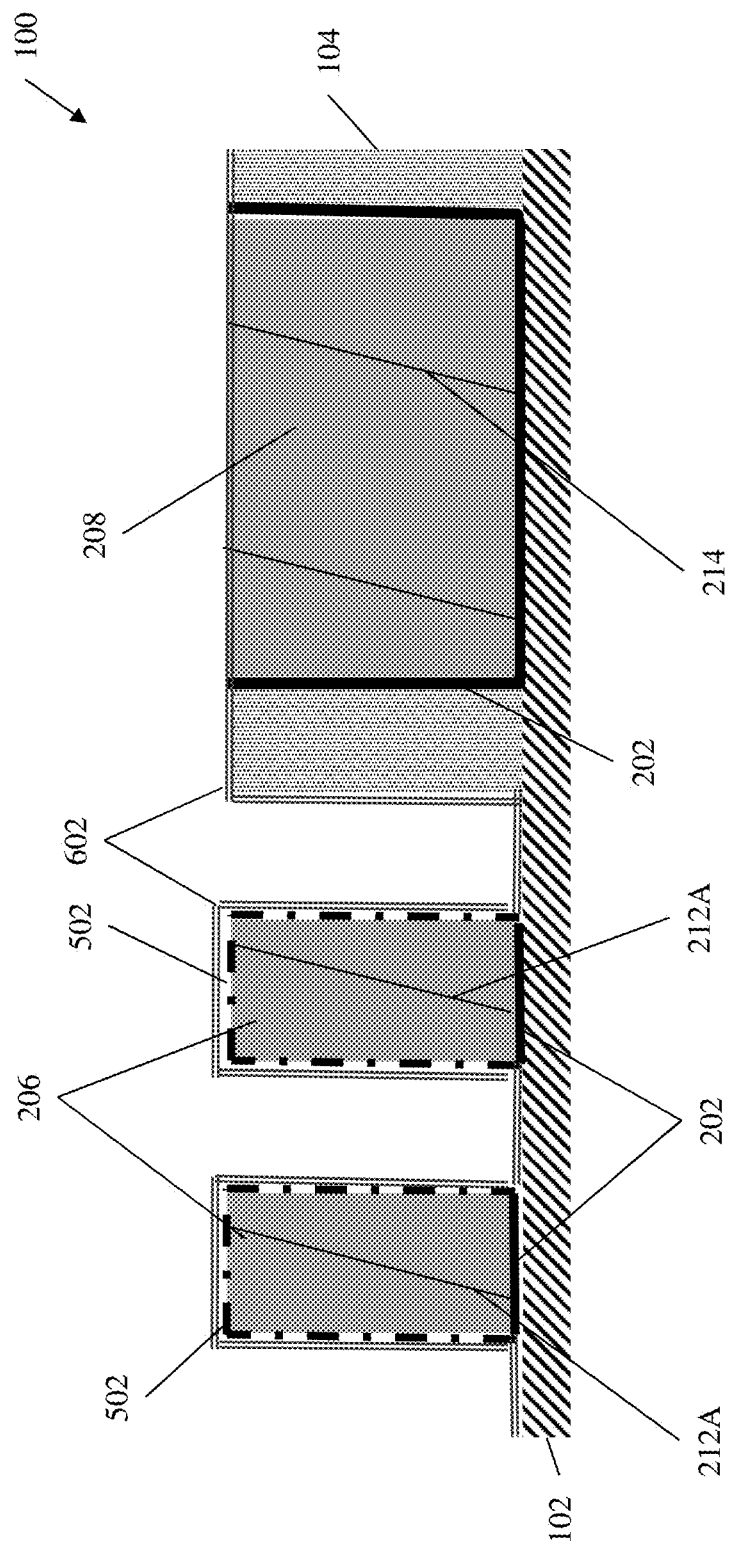

In FIG. 6, known fabrication operations have been used to remove the hard mask 302 from the conductive material 208 and portions of the dielectric insulator layer 104. A dielectric cap layer 602 can be deposited conformally over portions of the substrate 102, the liner layer 502, portions of the dielectric insulator layer 104, portions of the liner layer 202 and the conductive material 208. In one or more embodiments of the invention, the dielectric cap layer 602 can be any type of insulator including but not limited to silicon nitride, silicon carbide, silicon oxide, and the like. The deposition of the dielectric cap layer 602 can be performed using any deposition process including but not limited to chemical vapor deposition (CVD) and atomic layer deposition (ALD).

Figure 7:
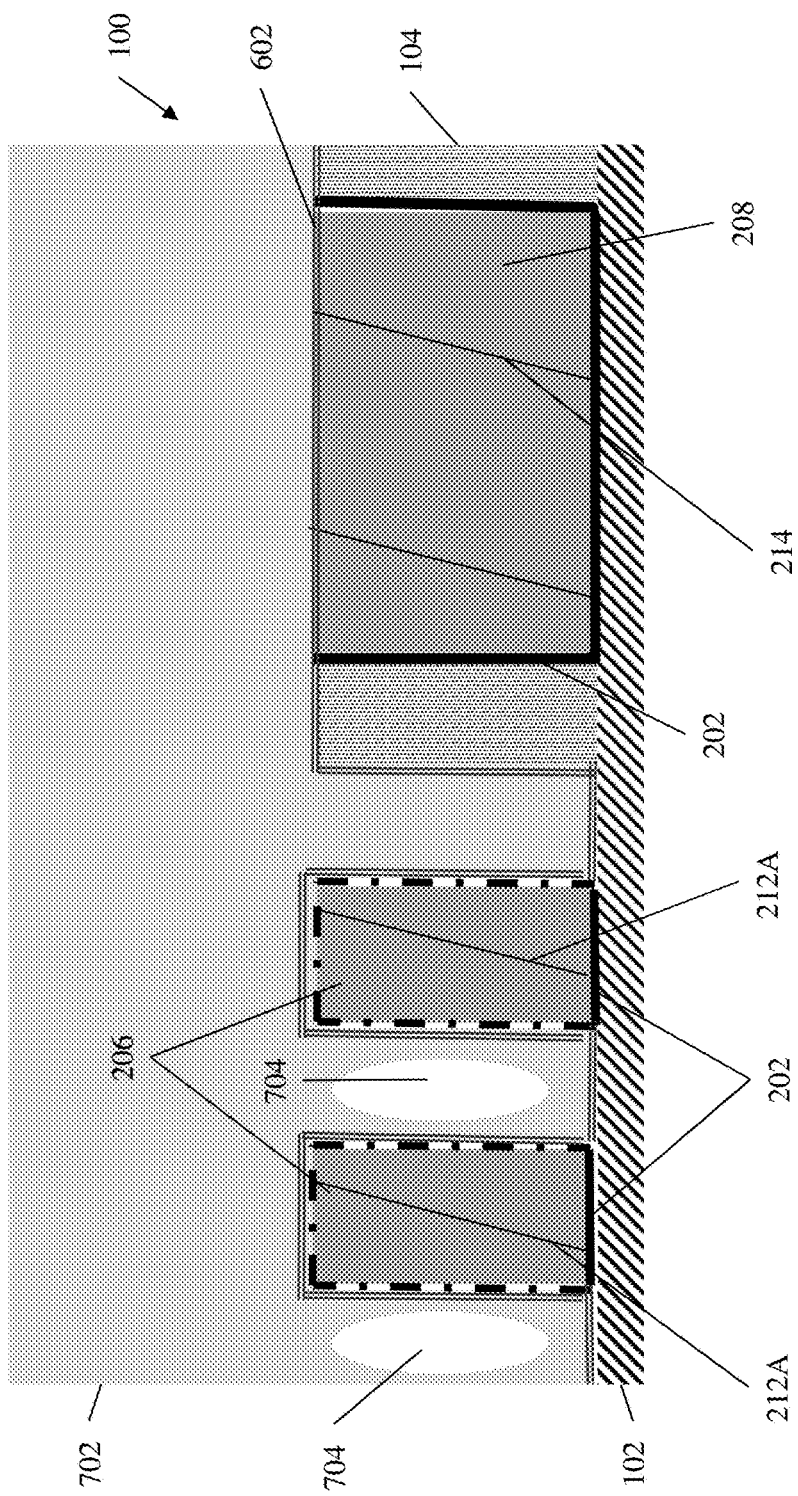

In FIG. 7, known semiconductor fabrication operations have been used to deposit a dielectric 702 over the dielectric cap layer 602. The dielectric 702 can be any type of dielectric material including but not limited to the same type of dielectric material used to form the dielectric insulating layer 104. The dielectric 702 can be deposited using any type of deposition process including but not limited to CVD, ALD, and spin-on. Air gaps 704 can optionally be formed in the dielectric 702 between the conductive materials 206. In embodiments of the invention, known fabrication operations can be used to form the air gaps 704. The air gaps 704 can lower the effective capacitance between adjacent instances of the narrow conductive materials 206.

Figure 8:
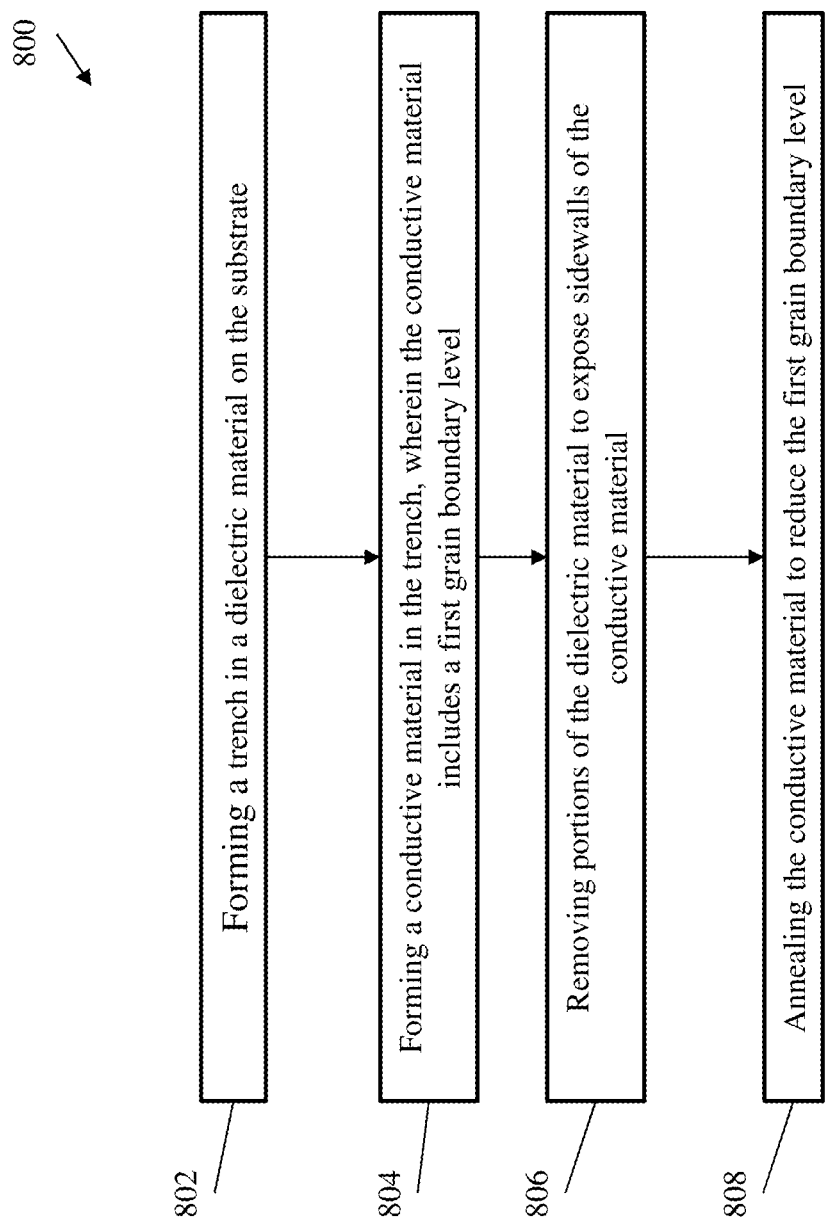
FIG. 8 depicts a flow diagram of a method according to one or more embodiments of the invention.

FIG. 8 depicts a flow diagram further illustrating a method 800 for forming a conductive region 206 of a metallization network associate with a substrate 102 according to one or more embodiments of the invention. The method 800 includes forming a trench in a dielectric material on the substrate, as shown in block 802. At block 804, the method 800 includes forming a conductive material in the trench, wherein the conductive material includes a first grain boundary level. The method, at block 806, includes removing portions of the dielectric material to expose sidewalls of the conductive material. And at block 808, the method 800 includes annealing the conductive material to reduce the first grain boundary level.

Additional processes can also be included. It should be understood that the processes depicted in FIG. 8 represent illustrations and that other processes can be added or existing processes can be removed, modified, or rearranged without departing from the scope and spirit of the present invention.

Figure 9:
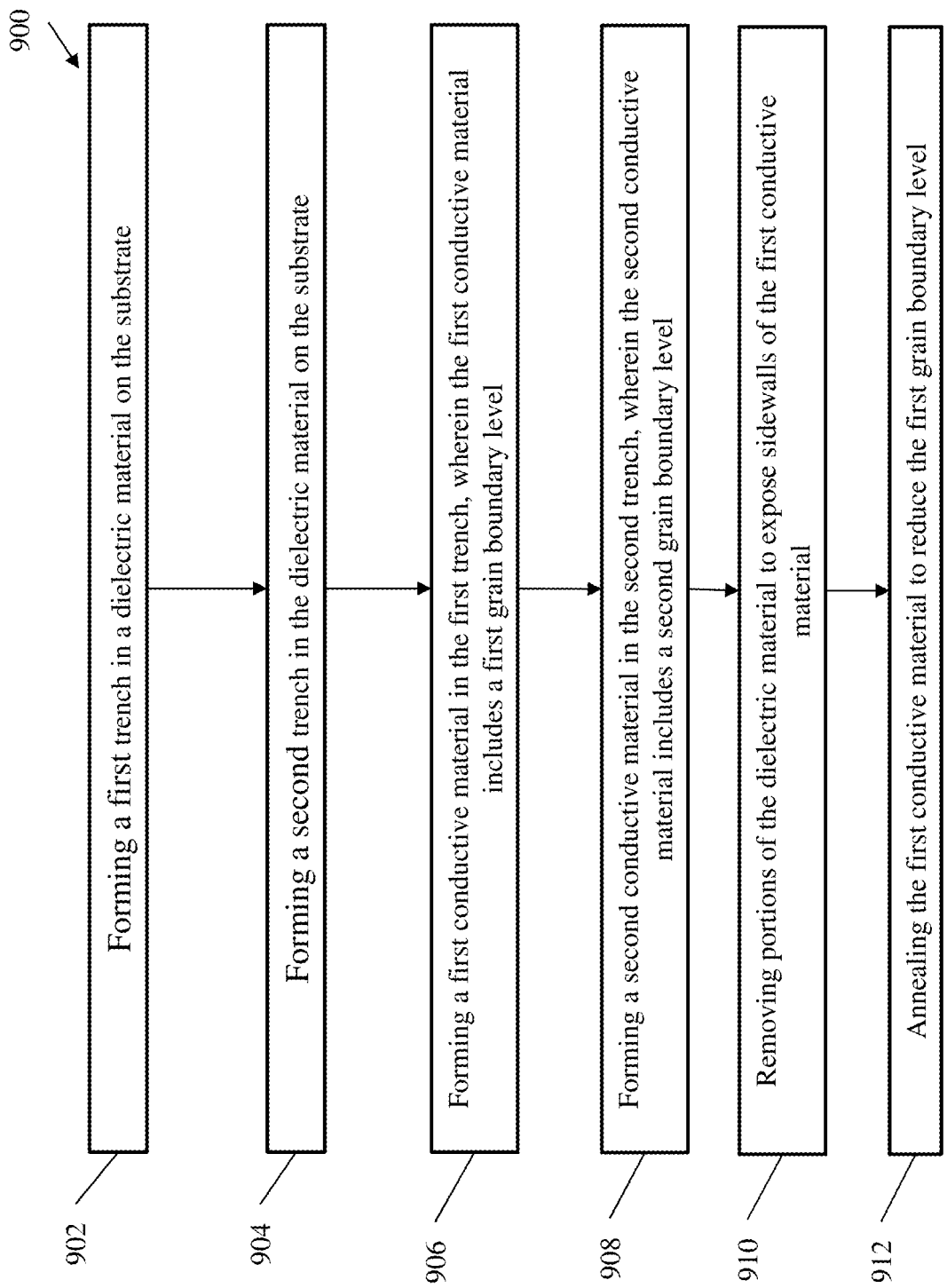
FIG. 9 depicts a flow diagram of a method according to one or more embodiments of the invention.

FIG. 9 depicts a flow diagram of a method 900 for forming the conductive regions 206 in a metallization network associate with the substrate 102 according to one or more embodiments of the invention. The method 900 includes forming a first trench in a dielectric material on the substrate, as shown in block 902. The method 900, at block 904 includes forming a second trench in the dielectric material on the substrate. The method 900 includes forming a first conductive material in the first trench, wherein the first conductive material includes a first grain boundary level, as shown at block 906. And at block 908, the method 900 includes forming a second conductive material in the second trench, wherein the second conductive material includes a second grain boundary level. The method 900, at block 910, includes removing portions of the dielectric material to expose sidewalls of the first conductive material. And at block 912, the method 900 includes annealing the first conductive material to reduce the first grain boundary level.

Additional processes can also be included. It should be understood that the processes depicted in FIG. 9 represent illustrations and that other processes can be added or existing processes can be removed, modified, or rearranged without departing from the scope and spirit of the present invention.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A semiconductor structure comprising:
   a first conductive material formed in a first trench, wherein the first conductive material includes a first grain boundary level;
   a second conductive material formed in a second trench, wherein the second conductive material includes a second grain boundary level;
   a third conductive material formed in a third trench, wherein the third conductive material includes a third grain boundary level;
   a first liner layer formed over the first conductive material and the second conductive material;
   a second liner layer formed over the first liner layer and the third conductive material;
   a second dielectric material over the first liner layer; and
   one or more airgaps in the second dielectric material between the first conductive material and the second conductive material.

2. The semiconductor structure of claim 1, wherein the first trench comprises an aspect ratio greater than or equal to 2.5.

3. The semiconductor structure of claim 1, wherein the second trench comprises an aspect ratio less than or equal to 2.5.

4. The semiconductor structure of claim 1 further comprising a protective layer formed on sidewalls of the first conductive material.

5. The semiconductor structure of claim 4, wherein the protective layer comprises hydrogen silsesquixane.

6. The semiconductor structure of claim 1, wherein the first trench and the second trench each comprise an aspect ratio less than 2.5.

* * * * *